(12) United States Patent
Hidri

(10) Patent No.: US 9,800,228 B2
(45) Date of Patent: Oct. 24, 2017

(54) DELAY LINE SYSTEM, HIGH FREQUENCY SAMPLER, ANALOG-TO-DIGITAL CONVERTER AND OSCILLOSCOPE

(71) Applicant: Rohde & Schwarz GmbH & Co. KG, Munich (DE)

(72) Inventor: Ols Hidri, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 116 days.

(21) Appl. No.: 14/859,899

(22) Filed: Sep. 21, 2015

(65) Prior Publication Data
US 2017/0005640 A1 Jan. 5, 2017

(30) Foreign Application Priority Data
Jul. 3, 2015 (EP) .................................... 15175221

(51) Int. Cl.
  *H03H 11/26* (2006.01)
  *G01R 13/02* (2006.01)
  *H03K 5/159* (2006.01)
  *H03M 1/12* (2006.01)

(52) U.S. Cl.
  CPC ....... *H03H 11/265* (2013.01); *G01R 13/0272* (2013.01); *H03K 5/159* (2013.01); *H03M 1/124* (2013.01); *H03M 1/1215* (2013.01)

(58) Field of Classification Search
  USPC ........ 324/617, 76.24, 76.35, 76.54; 327/153, 327/161, 182, 250
  See application file for complete search history.

(56) References Cited

U.S. PATENT DOCUMENTS

| | | | | |
|---|---|---|---|---|
| 3,617,763 | A | * | 11/1971 | Laskowski ......... G03B 15/0457 307/41 |
| 7,446,693 | B1 | * | 11/2008 | Perraud .................. H03M 1/64 341/155 |
| 2002/0145484 | A1 | | 10/2002 | Agoston et al. |
| 2012/0237202 | A1 | * | 9/2012 | Abe ..................... H04B 10/616 398/16 |
| 2013/0027234 | A1 | | 1/2013 | Yoshida et al. |
| 2014/0159991 | A1 | * | 6/2014 | Kiss ..................... H03F 3/2175 343/904 |

FOREIGN PATENT DOCUMENTS

WO  WO9406121 A1  3/1994

OTHER PUBLICATIONS

Lee, et al., "A 50GS/s Distributed T/H Amplifier in 0.18 micron SiGe BiCMOS", IEEE International Solid-State Circuits Conference, 1-4244-0852-0/07, pp. 466-467, 616, 2007.

* cited by examiner

Primary Examiner — Vincent Q Nguyen
(74) Attorney, Agent, or Firm — Potomac Technology Law, LLC

(57) ABSTRACT

A delay line device is provided for a high frequency sampler for high frequency signal transmission, or for an oscilloscope for measuring high frequency signals. The delay line device includes two distributed tapped transmission delay lines. Each of the delay lines includes two terminals. An analog input signal is applied to a first terminal of the first delay line, and a clock signal is applied to a first terminal of the second delay line. The delay lines are configured such that the analog input signal propagates through the first delay line in an opposite direction as compared to the propagation of the clock signal through the second delay line.

12 Claims, 8 Drawing Sheets

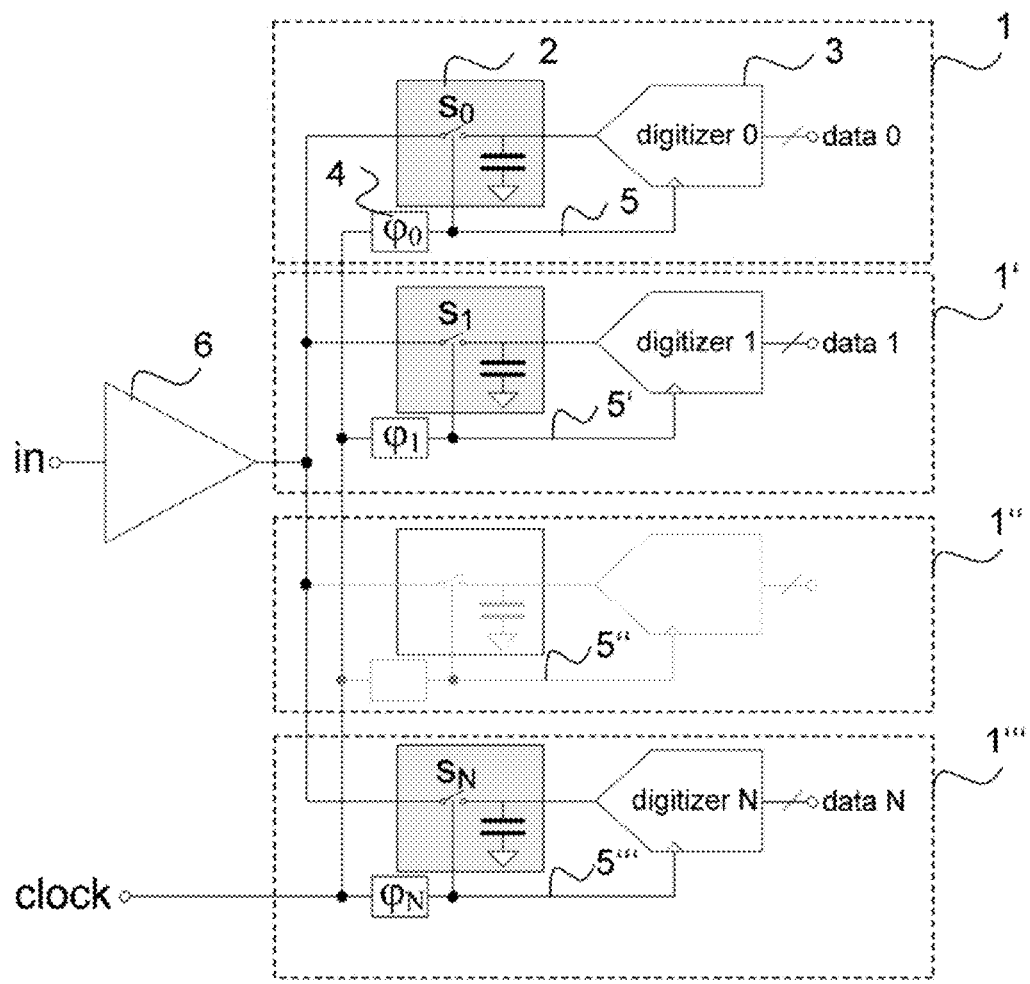
Fig.1 - Prior Art

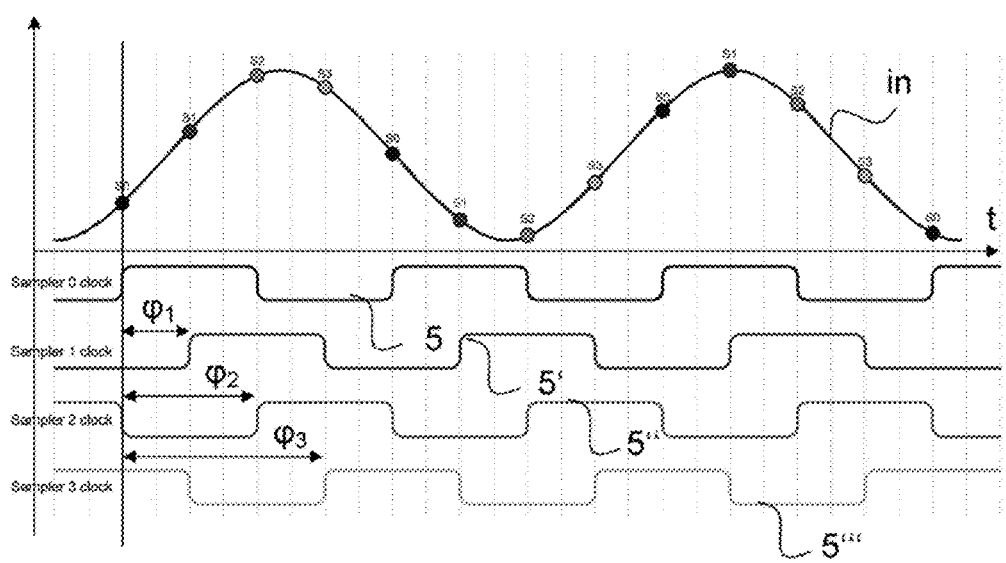
Fig. 2 - Prior Art

DELAY LINE SYSTEM, HIGH FREQUENCY SAMPLER, ANALOG-TO-DIGITAL CONVERTER AND OSCILLOSCOPE

PRIORITY

This application claim priority from European patent application No. EP 15175221.9, filed on Jul. 3, 2015, the entirety of which is hereby incorporated by reference herein.

FIELD

Embodiments of the present invention relate to a delay line system for high frequency signal transmission, to a high frequency sampler that comprises a delay line system, to an analog-to-digital converter that comprises a high frequency sampler, and to an oscilloscope for measuring high frequency signals that comprises an analog-to-digital converter.

BACKGROUND

The sampling frequency $f_S$ of an analog signal with frequency content from zero Hertz to B Hertz has to be higher than the Nyquist rate $f_N$ to avoid an aliasing effect. This can be expressed by the equation:

$$f_S \geq f_N = 2 \cdot B$$

Hence, as higher the analog input signal bandwidth B, as higher the necessary sampling rate $f_S$. That is why applications that deal with very high analog input bandwidths B, such as Real-Time-Oscilloscopes, short RTO, call for very high sampling speeds.

Referring to WO 94/06121 A1, a high speed transient sampling unit is described. Therein, a tapped transmission line is used to propagate an input signal from an input node to an output node of the transmission line. The taps are provided with high speed sampling gates at which a distributed strobe signal is applied. Each sampling gate obtains the same distributed strobe signal without phase shifting. Therefore, at each tap of the transmission line, the same strobe signal is applied so that the sampling speed is increased.

Another method for increasing the sampling speed is shown in FIG. 1. Therein an input node is shown for applying an analog input signal IN that needs to be sampled using a so-called interleaved sampling architecture. Such an interleaved sampling architecture is for instance described in prior art document US 2013/0027234 A1. The interleaved sampling architecture is very attractive for increasing the sampling speed. Therein individual analog-to-digital converters (ADC) 1', 1" and 1'" are interleaved in that the overall sampling speed of the system is increased. Thus, each ADC obtains a distinct sampling unit 2 and a distinct digitalization unit 3 on which a sampling clock 5 is provided. Thus, a time interleaving is obtained that increases the overall sampling speed of the system by operating two or more ADC in parallel. As a rule of thumb, operating N numbers of ADCs in parallel increases the system sampling rate by approximately a factor of N.

Each ADC includes a phase shifting unit 4 that is applied to delay the specific sampling clock 5 for each specific ADC. Each sampling unit 2 in front of the respective ADC thus receives the clock signal with a determined phase shift $\phi_0$, $\phi_1, \ldots, \phi_N$ such that the sampling units 2 sampling moments are equidistantly spaced in time. Thus the interleaved operation is achieved that results in an effective clock signal $f_{eff}$. By using a clock signal of a frequency $f_{clock}$ an effective clock can be expressed by the equation:

$$f_{eff} = f_{clock} \cdot N$$

Thus, a higher sampling speed is achieved with such an architecture.

The clock timing diagram of a four times interleaved sampler is shown in FIG. 2. The sampling clock 5 is applied to the ADC 1 and provides the samples S0. The clock 5' provides a sampling clock that is phase shifted by the phase shifter 4' with a phase $\phi_1$ and provides the samples S1 of the input signal IN. The clock 5" provides a sampling clock that is phase shifted by the phase shifter 4" with a phase $\phi_2$ and provides the samples S2 of the input signal IN. The clock 5'" provides a sampling clock that is phase shifted by the phase shifter 4'" with a phase $\phi_3$ and provides the samples S3 of the input signal IN. The sampling clocks 5, 5', 5", 5'" are time shifted by specific phase shifters 4 to obtain a higher sampling rate for the input signal IN.

Time interleaved sampling architectures relaxes a lot the power consumption of the following digitizing unit 3, 3', 3", 3'" in a given technology and its comparators meta-stability caused errors.

However, the advantages of the interleaved architecture do not come without drawbacks. Various limitations and considerations must be taken into account before turning interleaving into a successful solution.

One drawback is the bandwidth limitation. Each of the sampling units 2 shown in FIG. 1, when operating alone, usually has a high analog bandwidth B. However, connecting the sampling units 2, in a tree fashion will severely reduce the overall signal bandwidth B at their inputs. The bandwidth reduction is caused by parasitic effects from the input line metal routing connecting the analog signal to each of the sampling units 2, since the metal routing comprises a specific inductance, resistance and/or capacitance. The parasitic effects cause various effects. Additionally, parasitic effects from the sampling units own inputs reduces the bandwidth B due to an additional load at the input line at all time, even though only one sampling unit 2 operates at one time. Hence, as the number N of interleaved sampling units 2 increases, the bandwidth B will degrade. As a consequence, usually the number N of interleaved sampling units 2 directly connected to the analog input IN is limited to four.

Another drawback is the clock deterministic and random phase error. If the sampling instants of time interleaved samplers are not equidistant in time, then the sampled input signal will contain errors which appear at determined frequencies in its spectrum. Furthermore, as the analog input bandwidth B increases, as the error generated by the error sampling instants increases.

The input clock signal has to be physically routed to all the sampling units 2. Additionally, each sampling unit 2 receives a phase adjusted input clock, phase shifted by the specific phase shifting units 4, 4', 4", 4'". It is quite clear that with a higher number N of interleaved sampling units 2, a longer metal routing of the clock signal has to be used. This longer metal routing will reduce the bandwidth B of the clock signal until it arrives at the specific sampling unit 2. Hence, the clock signal needs further intermediate re-buffering to maintain its signal level. All the necessary clock signal re-buffering will not just introduce random source of errors in the clock signal, but will deteriorate its phase stability. This makes it more difficult to generate and maintain equally spaced sampling instants.

Assuring that each sampler receives the correct clock phase is usually done by a local phase shifting unit 4 that is applied close to the sampling unit 2. As the number N of the interleaved sampling unit 2 increases, the phase correction range increases. Thus, the complexity of the local phase shifting unit 4 increases. The phase shifting unit 4 will also add random noise sources to the clock signal and will suffer from phase instability due to temperature, processing, etc.

Another drawback is the offset and the gain error. Gain and offset mismatches between the ADC 1 outputs are parameters of concern in a time interleaved system. If one channel that comprises a specific sampling unit 2 and a respective digitizing unit 3 shows an offset and a gain error, the digitized signal represents not only the original input signal IN but also an undesired error in the digital domain. Offset discrepancy and gain mismatches show up signal spurs in the spectrum of the digitized signal.

What is therefore needed is an approach for an interleaving sampling structure for an analog-to-digital converter that increases the sampling speed without a bandwidth limitation, a clock deterministic and random phase error.

SUMMARY OF THE INVENTION

Embodiments of the present invention advantageously address the foregoing requirements and needs, as well as others, by providing approaches for an interleaving sampling structure for an analog-to-digital converter that increases the sampling speed without a bandwidth limitation, a clock deterministic and random phase error.

In accordance with example embodiments of the present invention, a delay line system for high frequency signal transmission is provided. The delay line system comprises a first delay line that comprises a first terminal and a second terminal, wherein an analog input signal is applied to its first terminal. The system comprises a second delay line that comprises a first terminal and a second terminal, wherein a clock signal is applied to its first terminal. The first delay line and the second delay line are tapped delay lines. The analog input signal that propagates on the first delay line propagates in an opposite direction to the clock signal that propagates on the second delay line. Thus, the analog input signal and the clock signal are propagating towards each other in their respective delay lines in the inventive delay line system, which is achieved by applying the clock signal at an opposite terminal compared to the analog input signal.

According to such embodiments, the tapping concept and the interleaved method are combined in an advantageous manner to obtain the synergy effect of sampling speed increasing. More specifically, in order to mitigate the bandwidth limitation related to the analog input signal and the clock re-buffering, the tapping concept is used, whereby the delay lines are distributed or segmented, wherein, for example, the delay line comprises taps between its delay elements. Further, by applying the analog input signal at a first terminal of the first delay line and the clock at the first terminal of a second delay line that is arranged at an opposite end in the delay line system, the analog input signal propagates toward the clock signal in the delay line system. At each tap of the delay line system a respectively delayed analog signal can be sampled with a respectively delayed clock signal. The interleaving operation is thus achieved in an improved manner by using the delay properties of a delay line and by letting the analog signal and the clock signal propagate towards each other in their respective tapped delay line.

According to one embodiment, the first delay line is arranged in parallel to the second delay line, wherein the first terminal of the first delay line is arranged at an opposite end to the first terminal of the second delay line. This leads to the opposite propagation of the analog input signal compared to the clock signal and leads to the inventive concept.

According to a further embodiment, the first delay line and the second delay line each comprise equally dimensioned delay elements, wherein the number of delay elements in the first delay line equals the number of delay elements in the second delay line.

According to such embodiments, the delay elements allow the application of an analog input signal and clock signal with a higher bandwidth compared to a tree fashion signal routing line according to the prior art solutions.

By way of example, the delay elements are of the same length, the same parameters and/or the same materials. Using an equal number of delay elements for the first delay line and the second delay line allows the interleaving effect directly and provides the interleaved and tapping concept.

By way of further example, the delay element comprises a piece of a transmission line and/or a discrete element arranged at the delay line. This allows an easy manufacturing of the delay line system and avoids high complex metal routing structures for obtaining the interleaving. Thus, bandwidth reduction and phase errors as described above are avoided.

By way of further example, the discrete elements are built as a circuit arrangement that comprises a series inductance and a capacitance, wherein the capacitance is connected to a reference potential.

By way of further example, the delay elements between the respective terminal of the delay line and the respective first tap cause a first propagation delay that is different to a second propagation delay, caused by the delay elements between two consecutive taps. However, the characteristic impedance of all delay elements in the delay line system is the same. It is advantageous, that the first propagation delay of the delay elements directly connected to the respective terminals of the respective delay line is equal to each other, wherein it might be different to the second propagation delay of the delay elements between two consecutive taps. The different propagation delays are caused by different routing schemes.

According to a further embodiment, the first delay line and the second delay line are tapped, wherein a tap is arranged between two adjacent distribution segments of the respective delay line. The taps are used to apply a sampling unit to the delay line, wherein a tap of the first delay line is arranged in close proximity to a tap of the second delay line. This avoids long metal routings and provides an interleaved sampling unit operating at higher sampling rates without bandwidth limitations and clock and phase errors.

By way of example, the taps are arranged in such a way that each tap of the first delay line corresponds to a tap of the second delay line. Using the same delay line segments between consecutive taps of clock and the analog input signal lines, preferably leads to equally time spaced sampling instants.

According to a further embodiment, a delay element is arranged between two adjacent taps, wherein, for example, the delay element in the first delay line equals the delay element in the second delay line. Thus, identical delay elements are used in the delay line system, which leads to equal time delays of the input signal and the clock signal in the respective delay line.

By way of further example, the taps are arranged in equal distance in both delay lines.

According to example embodiments, an improved way to increase the signal bandwidth in a given technology is the exploitation of a tapping (distributed) concept by using tapped delay lines that comprises dedicated distribution points/taps between its delay elements. In a given discrete circuit, the parasitic capacitance at its input will deteriorate the bandwidth at its terminal node. The use of tapped delay lines evades this problem by absorbing the circuit input capacitance into the characteristics parameter of tapped delay elements. Consequently, the distributed delay line can operate a substantially higher frequency than the tree fashion signal routing line according to the prior art.

According to one embodiment, the tapped delay lines are preferably built as a mix of transmission line segments and discrete elements and/or completely in a discrete fashion and are terminated to their characteristic impedance $Z_0$. The line characteristic impedance $Z_0$ can be computed as:

$$Z_0 = \sqrt{L/C}$$

where the inductance L is the total inductance of the line segment between two adjacent tap points and C is the sum of the line segment capacitance between two adjacent taps plus the input capacitance of the circuit connected to the tap.

The tapped delay line allows the propagation of an input signal with a very high bandwidth B. The line cut-off frequency $\omega_c$ can be computed as:

$$\omega_c = \frac{2}{\sqrt{L \cdot C}}$$

A voltage step applied to the first terminal propagates down the tapped delay line, causing the step signal to appear at each lumped circuit input in succession. If the structure is periodic, such that all delay elements between consecutive taps are similar, the step signal will appear with equal delays at successive tap points. The propagation velocity is usually at least 50 percent of speed of light in free space depending on the equivalent permittivity value of the delay element.

Another way to quantify the delay $\tau$ at successive tap points is by computing the formula:

$$\tau = \sqrt{L \cdot C}$$

where the inductance L is the total inductance of the line segment between two adjacent tap points and C is the sum of the line segment capacitance between two adjacent taps plus the input capacitance of the circuit connected to the tap.

In accordance with further example embodiments of the present invention, a high frequency sampler is provided that comprises a delay line system according to the above mentioned manner. The sampler is an interleaved sampler in that both delay lines are tapped. By way of example, the delay lines are arranged in such a way that each tap of the second delay line is physically close to a tap of the first delay line. Thus, each of the sampling units of the high frequency sampler receives the input signal and the clock signal with no further metal routing and even more important, any residual parasitic capacitance of the clock signal path or the analog input signal path of the sampling units or in the input lines or line terminals are included in the tapped line characteristics. By way of further example, a buffer could be used locally on each sampling unit for the analog input signal and the clock signal on each tap.

The interleaving operation of the high frequency sampler is thus achieved in an improved manner by using the delay properties of the specific delay line and by an opposite propagation of the analog input signal and the clock signal in their respective tapped line.

According to one embodiment, the taps are arranged between two adjacent distribution segments of the respective delay line, wherein the taps are arranged in such a way that each tap of the first delay line corresponds to a tap of the second delay line and wherein each tap of the first delay line and a corresponding tap of the second delay line is connected to a distinct sampling unit. The sampling unit provides a sampling output signal in case the clock signal enables the sampling unit. The enabling and disabling of the sampling unit is achieved by the clock signal, preferably by detecting a rising or falling edge of the clock signal.

By way of example, the clock period of the clock signal is at least equal to the sum of the propagation time between two consecutive taps on the second delay line and the propagation time between two consecutive taps on the first delay line, wherein the sum is multiplied by an interleaved factor. This is the minimum clock period to avoid double sampling caused by the next clock edge travelling along the delay line.

By way of further example, the same type of delay elements is used for the first delay line and the second delay line to obtain similar propagation times of the respective signals. Choosing similar delay elements is advantageous for physically aligning analog taps and clock taps for eliminating extra clock or analog signaling to each sampling unit.

In accordance with further example embodiments of the present invention, an analog-to-digital converter comprising a high frequency sampler according to the above mentioned manner is provided. By way of example, the ADC comprises a high interleaved factor, such as 4, 6, 8, 10 or even 16. Since the delay line bandwidth limitation and phase error is heavily reduced using the tapping concept in combination with the interleaved method, a higher number of sampling units can be provided in the interleaving method, which advantageously leads to higher sampling rates. Since the parasitic capacitance deteriorates the bandwidth of the terminal node and the tapping concept evades this problem by absorbing the circuit input capacitance into the characteristic parameters of a tapped delay line.

By way of further example, each tap of the first delay line and the corresponding tap of the second delay in the high frequency sampler of the ADC are connected to a distinct sampling unit, wherein the output of the sampling unit is digitized by a digitizing unit. Further, the digitizing unit may include a quantization and/or binarization unit in order to provide a discrete signal that is corresponding to the analog sample of the sampling unit.

In accordance with further example embodiments of the present invention, an oscilloscope is provided for measuring high frequency signals, wherein the oscilloscope comprises an input node for applying a high frequency analog input signal and an ADC according to the previously described manner to the input node for converting the analog input signal to a digital input signal. The oscilloscope with the inventive ADC can be used for ultra high speed sampling architectures, especially within the next generation RTOs concept with sampling units operative up to 160 Gigahertz sampling rate.

BRIEF DESCRIPTION OF THE DRAWINGS

Embodiments of the present invention are illustrated by way of example, and not by way of limitation, in the figures of the accompanying drawings, in which like reference numerals refer to similar elements, and in which:

FIG. 1 shows an ADC using an interleaved sampling concept according to the prior art;

FIG. 2 shows an example time signaling diagram of the ADC of FIG. 1;

DETAILED DESCRIPTION

Approaches for an interleaving sampling structure for an analog-to-digital converter that increases the sampling speed without a bandwidth limitation, a clock deterministic and random phase error, are provided. In the following description, for the purposes of explanation, numerous specific details are set forth in order to provide a thorough understanding of the embodiments of the invention. It is apparent, however, to one skilled in the art that the embodiments of the invention may be practiced without these specific details or with an equivalent arrangement. In other instances, well-known structures and devices are shown in block diagram form in order to avoid unnecessarily obscuring the embodiments of the invention.

Figure 3A:
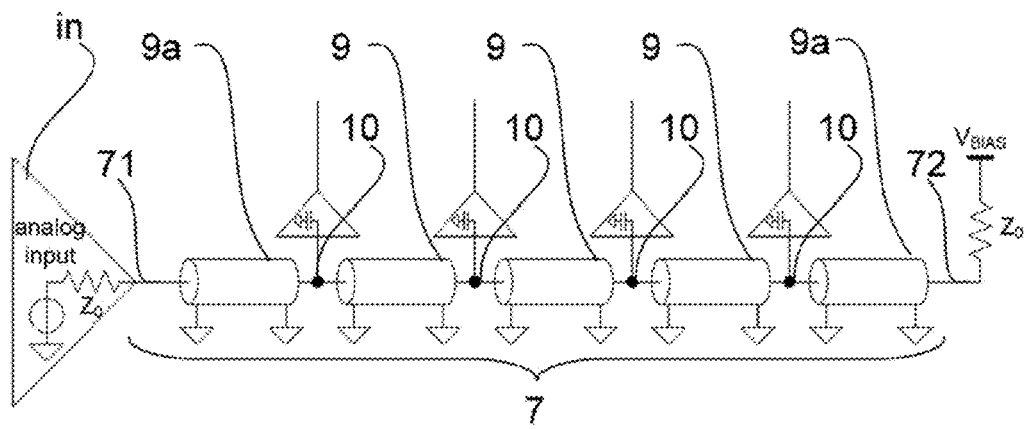
FIG. 3a shows a first tapping concept used in an interleaved ADC, according to example embodiments of the present invention.
Figure 3B:
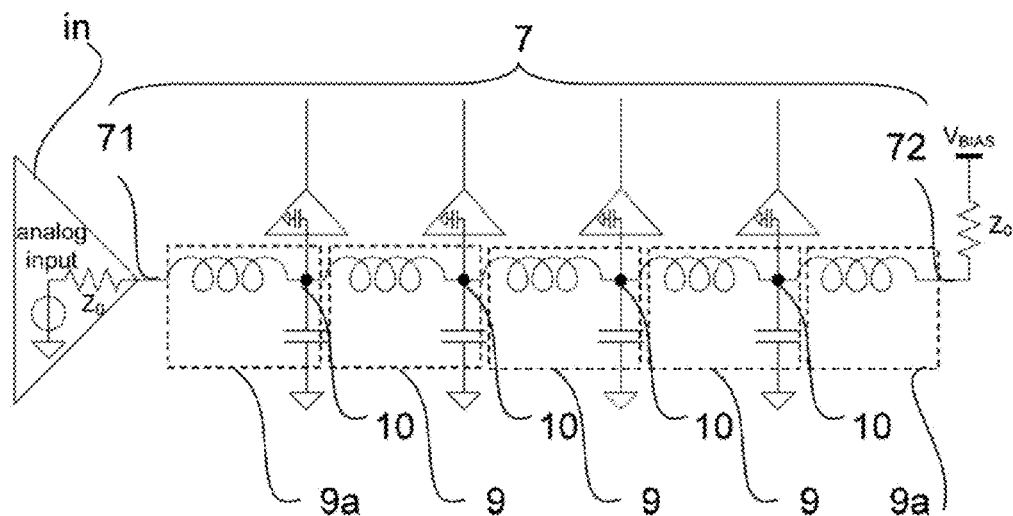
FIG. 3b shows a second tapping concept used in an interleaved ADC, according to example embodiments of the present invention.

FIGS. 3a and 3b show tapping concepts used in an interleaved ADC, according to example embodiments of the present invention. In a given lumped circuit, the parasitic capacitance at its input node will deteriorate the bandwidth at its terminal node. The tapping concept evades this problem by absorbing the circuit input capacitance into the characteristic parameters of a tapped delay line. Consequently, the tapped delay line 7 can operate at substantially higher signal bandwidths compared to the tree fashion signal routing line, shown in FIG. 1.

FIG. 3a shows a first tapping concept used in an interleaved ADC, according to example embodiments of the present invention. With reference to FIG. 3a, the first delay line 7 comprises a first terminal 71 and a second terminal 72. At the first terminal 71, an analog input signaling IN is applied. At the second terminal 72, a termination resistance $Z_0$ is connected to terminate the first delay line 7. A bias voltage $V_{bias}$, which could be also the ground signal, is applied at the second terminal 72 of the first delay line 7 in order to bias the first delay line 7. The first delay line 7 according to FIG. 3a comprises 5 delay elements 9 and 9a, wherein the delay elements 9a are connected to the respective terminals 71 and 72 of the delay line 7. Each delay element 9, 9a according to FIG. 3a is implemented as a piece of a transmission line. Each transmission line segment delays the propagation of the analog input signal IN to a defined amount.

FIG. 3b shows a second tapping concept used in an interleaved ADC, according to example embodiments of the present invention. With reference to FIG. 3b, each delay element 9 and 9a is implemented with discrete elements. By way of example, each delay element 9, 9a is implemented as circuit arrangement of a series connection of an inductance L and capacitance C connected to the reference potential GND. Each circuit arrangement delays the propagation of the analog input signal IN to a defined amount.

Between two delay elements 9 in FIG. 3a and FIG. 3b, a tap 10 is arranged. The phrase "tap" is also referred to the phrase "distribution point", wherein four taps 10 are used in the first delay line 7 of FIG. 3b. At each tap 10, a sampling unit 2 might be applied (not shown).

The delay elements 9a between the respective terminals 71, 72 and the respective first tap 10 of the delay line 7 does not have to be equal to the delay elements 9 that are arranged in between two taps 10. The delay elements 9a comprise the same characteristic impedance $Z_0$ but the propagation delay τ between the delay element 9a and the delay element 9 might be different. For example, the transmission line 9a as a delay element 9a is as half as long as the transmission line 9 as a delay element 9 between two consecutive taps 10.

According to FIG. 3a and FIG. 3b the delay elements 9, 9a can be implemented as a piece of a transmission line or as discrete delay elements. Since the delay elements 9 are terminated to their characteristic impedance $Z_0$, a higher bandwidth B can be achieved for the first delay line 7. The line characteristic impedance $Z_0$ can be computed as:

$$Z_0 = \sqrt{L/C}$$

The tapped delay line allows the propagation of an input signal with a very high bandwidth B. The line cut-off frequency $\omega_c$ can be computed as:

$$\omega_c = \frac{2}{\sqrt{L \cdot C}}$$

Another way to quantify the delay τ at successive tap points is by computing the formula:

$$\tau = \sqrt{L \cdot C}.$$

The inductance L is the total inductance of a delay element 9 between two adjacent taps 10. The capacitance C is the sum of all delay element 9 capacitances between two adjacent taps 10 and the input capacitance of the lumped circuit connected at the tap 10.

The analog input signal IN applied to the first terminal 71 propagates down to the second terminal 72, causing the input signal to appear at each lumped circuit input in succession. Its structure is periodic such that all delay elements 9 between consecutive taps 10 are similar; a clock signal CLK will appear with equal delays τ with successive tap points 10. The propagation velocity is usually between 50 to 60 percent of speed of light in free spaced depending on the equivalent relative permittivity value $\epsilon_r$ of the delay element 9.

The delay elements 9 and the delay elements 9a might be equally dimensioned or might be different to each other. By way of example, the delay elements 9a may be implemented as pieces of a transmission line, wherein the delay elements 9 between two consecutive taps 10 are built as discrete elements 9 (or vice versa). By way of further example, each of the delay elements 9 between two consecutive taps 10 are implemented identically so that the same propagation delay τ between these two taps 10 is adjusted.

Figure 4A:
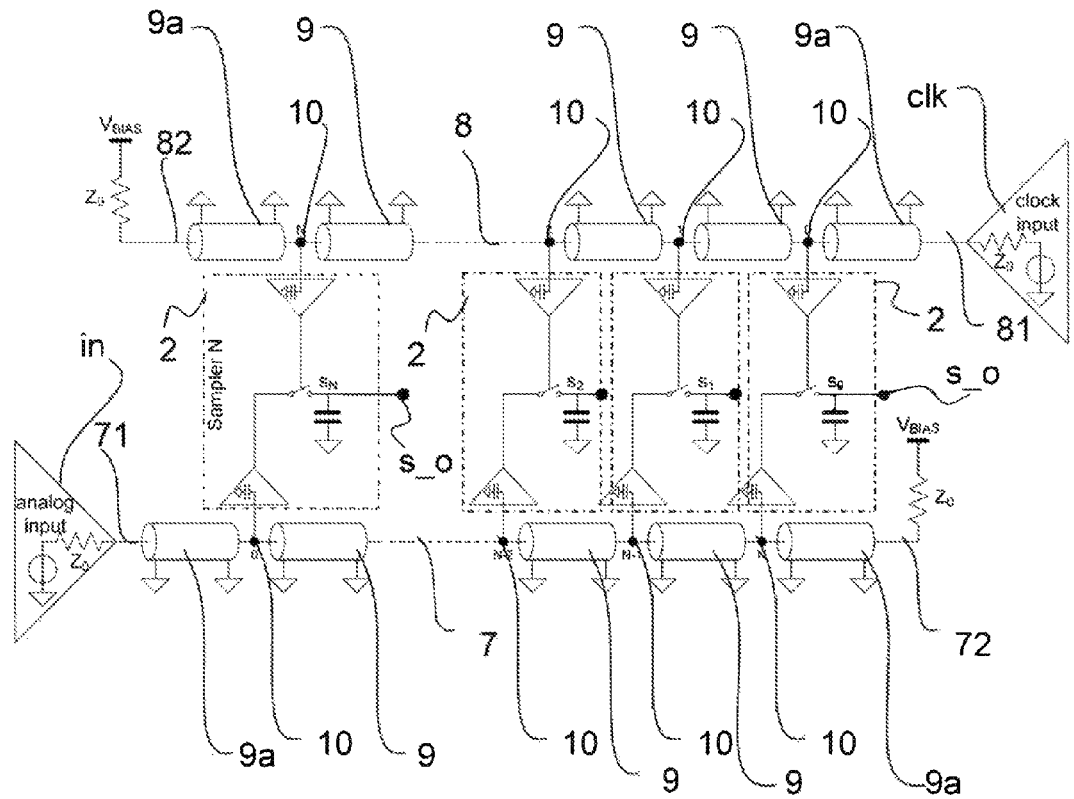
FIG. 4a shows a first delay line system, according to example embodiments of the present invention.

FIG. 4a shows a first delay line system, according to example embodiments of the present invention. With reference to FIG. 4, a first delay line 7 comprises a first terminal 71 and a second terminal 72. At the first terminal 71, an input signal IN of an analog characteristic is applied. The first delay line 7 comprises a number of delay elements 9 and is thus a tapped delay line. Between two delay elements 9, a tap 10 is arranged.

The delay line system further comprises a second delay line 8. The second delay line 8 comprises a first terminal 81 and a second terminal 82. The first terminal 81 of the second delay line 8 is provided with a clock signal CLK. The second terminal 82 of the second delay line 8 is terminated within delay line impedance $Z_0$ and is also biased with bias voltage $V_{bias}$ which could be also the ground signal.

As can be derived from FIG. 4, the clock signal CLK is applied at the first terminal 81 of the second delay line 8, which is the opposite end compared to the first delay line 7.

In order to mitigate the bandwidth limitation related to the analog input signal and the clock re-buffering, the tapping concept is used within an interleaving method. Both, the analog input signal IN and the clock signal CLK are routed to all the sampling units 2 which are arranged at corresponding taps 10 in between the first delay line 7 and the second delay line 8. The delay elements 9 are arranged physically in such a way that each tap 10 of the second delay is physically close to a tap 10 on the first delay line 7. In this way, each of the sampling units 2 receives the analog input signal IN and the clock signal CLK with no further routing. Additionally, the lumped parasitic capacitance in the clock signal CLK and the analog input signal IN of the sampling unit 2 are included in the tapped line characteristics. An input buffer 6 can be used locally on each sampling unit 2 for the analog input signal IN and the clock signal CLK on each tap 10.

An interleaving operation of the high frequency sampler is achieved in an improved manner by using the delay properties of the delay lines 7, 8 and by letting the analog input signal IN and the clock signal CLK propagates towards each other in their respective tapped delay lines 7, 8.

By using same delay elements 9 between consecutive taps 10 of the first delay line 7 and the second delay line 8, equally time spaced sampling instants are obtained. The delay line taps 10 may be arranged in the following manner.

If the taps 10 of the second delay line 8 and the first delay line 7 are numbered from zero through a number N with N+1 being the total number of taps 10 on each delay line 7, 8, where zero is the tap 10 closest to the first terminal 81 of the second delay line 8 and zero is also the tap 10 closest to the first terminal 71 of the first delay line 7, the first delay line 7 and the second delay line 8 are arranged in such a way that tap number K on the second delay line 8 corresponds to the tap number N−K on the first delay line 7.

Further, the delay elements 9 for the second delay line and the first delay line 7 may be dimensioned in the following manner.

The sum of propagation time $\tau_{clock}$ between two consecutive taps 10 on the second delay line 8 with propagation time $\tau_{analog}$ between two consecutive taps 10 on the first delay line 7 multiplied by the interleaved factor (which is N+1 according to FIG. 4) is equal to clock period $\tau_{Clock}$, which can be expressed as:

$$T_{clock} = (N+1) \cdot (T_{clock} + \tau_{analog})$$

In case, the same type of delay elements 9 are used for the first delay line 7 and the second delay line 8, the propagation time $\tau_{clock}$ is equal to the propagation time $\tau_{analog}$. Choosing similar delay elements 9 is advantageous for physically aligning the analog taps 10 to the clock taps 10 for eliminating extra clock or analog signal routing for the high frequency sampler.

At the output of each sampling unit 2 between the first delay line 7 and the second delay line 8, a sampling unit output signal S_O can be derived that provides a sample and hold value of the input signal IN at a specific sampling time S. For a high frequency sampler using four sampling units 2 in the inventive concept, a four times higher sampling rate $f_S$ is achieved and thus four different sampled values S_O are obtained.

Figure 4B:
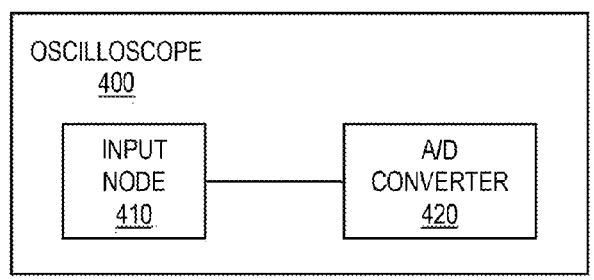
FIG. 4b shows an oscilloscope for measuring a high frequency analog input signal, according to example embodiments of the present invention.

FIG. 4b shows an oscilloscope 400 for measuring a high frequency analog input signal, according to example embodiments of the present invention. In accordance with such example embodiments, the oscilloscope 400 is provided for measuring high frequency signals, wherein the oscilloscope comprises an input node 410 for applying a high frequency analog input signal and an analog to digital converter (ADC) 420 according to the previously described manner to the input node for converting the analog input signal to a digital input signal. The analog-to-digital converter (ADC) is arranged downstream to the input node, and is configured to convert the high frequency analog input signal to a digital input signal The oscilloscope with the inventive ADC can be used for ultra-high speed sampling architectures, especially within the next generation RTOs concept with sampling units operative up to 160 Gigahertz sampling rate.

Figure 5:
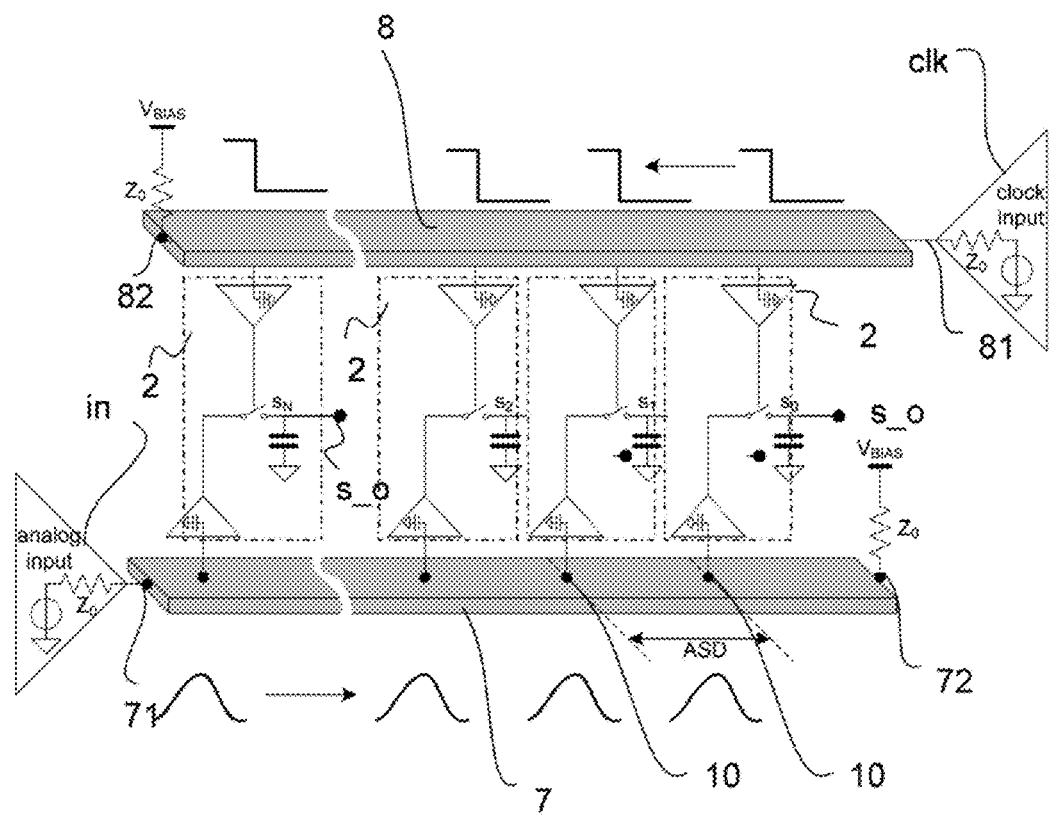
FIG. 5 shows a second delay line system, according to example embodiments of the present invention.

FIG. 5 shows a second delay line system, according to example embodiments of the present invention. Here, both, the analog input signal IN and the clock signal CLK travel towards each other in parallel arranged delay lines 7, 8. The analog input IN and the clock signal CLK comprise tapped delay elements 10 that are similar to each other. The taps 10 are equally spaced and distanced for both, the first delay line 7 and the second delay line 8. The propagation time $\tau_{clock}$ and the propagation time $\tau_{analog}$ are equal to an adjacent sampling distance divided by the velocity of the propagation signal. The delay lines 7, 8 could be any type of wave guide, for example microstrip, stripline, coplanar, etc.

For simplicity, the delay elements 9 are shown for single ended signals, but the concept is also valid in case the analog input signal IN or the clock signal CLK or both uses a differential signaling scheme. In this case, differential delay elements 9 are used for example a differential microstrip delay line. Differential signaling corresponds actually to most of the implementation cases.

The tapped delay lines 7, 8 could be also implemented in an integrated circuit chip technology, for example by using single ended or differential signals on the chip microstrip delay lines 7, 8.

Figure 6:
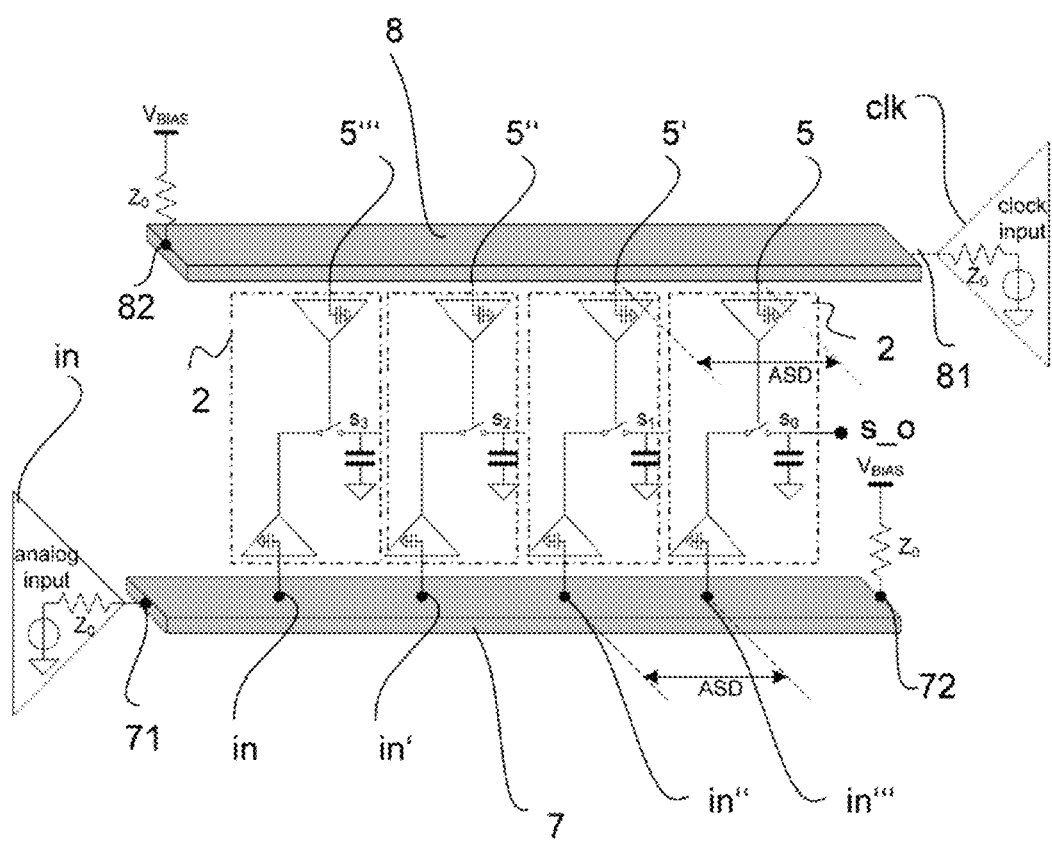
FIG. 6 shows a third delay line system, according to example embodiments of the present invention.
Figure 7:
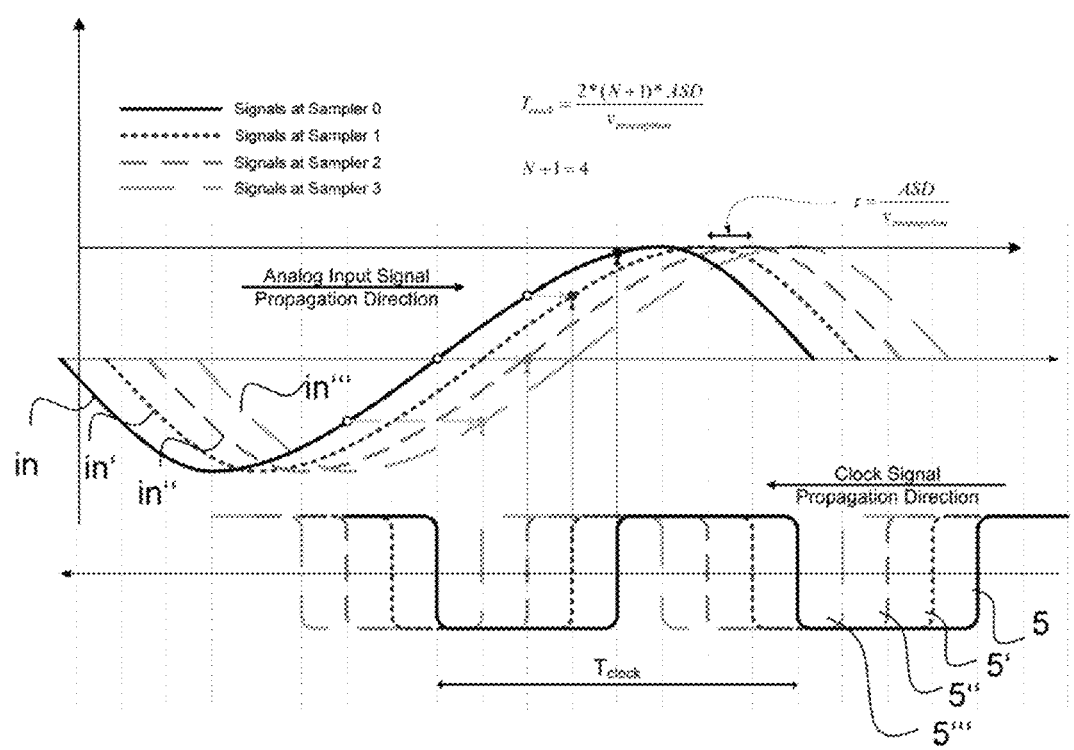
FIG. 7 shows the concept of opposite propagation direction of the input signal and the clock signal in a delay line system, according to example embodiments of the present invention.
Figure 8:
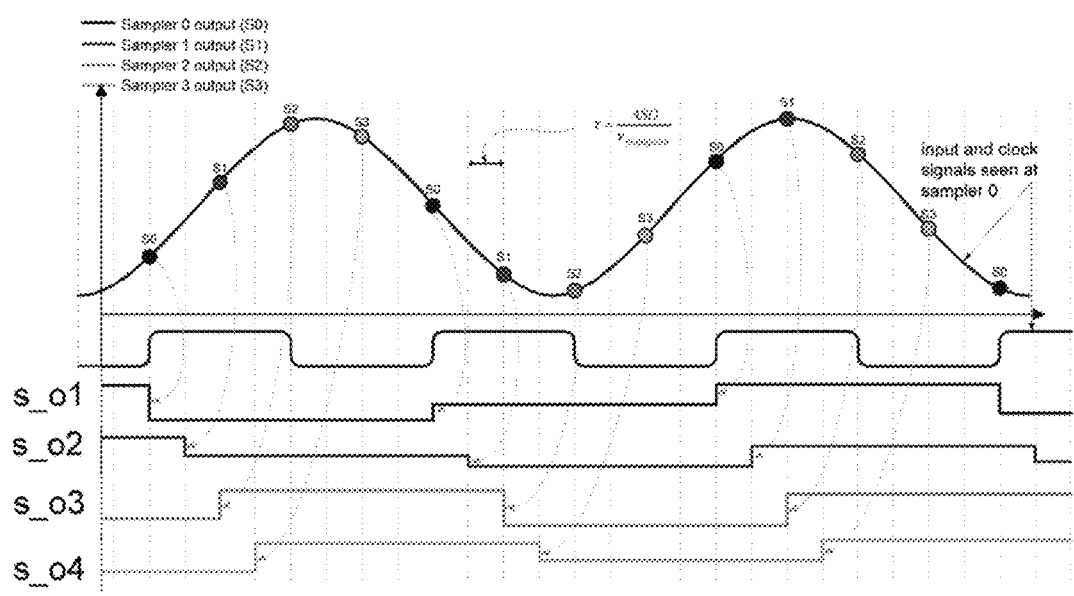
FIG. 8 shows a timing diagram of the implementation of an example embodiment of the present invention with four sampling units.

FIG. 6 shows a third delay line system, according to example embodiments of the present invention. The difference of the delay line system of FIG. 6, relative to that of FIG. 5, is that the number of sampling units 2 is referred to four, leading to four sampling units arranged between the first delay line 7 and the second delay line 8. This leads to four taps 10, wherein the analog input signal IN can be obtained at the four taps 10 with a specific delay as shown in FIG. 7 and FIG. 8. The same applies to the clock signal CLK and the four taps 10 on the second delay line 8.

FIG. 7 shows the concept of opposite propagation direction of the input signal and the clock signal in a delay line system, according to example embodiments of the present invention. As shown in FIG. 7, the analog input signal IN and clock signal CLK travel towards each other. Four different wave forms are shown for the analog input signal IN and the clock signal CLK. They represent the signals at the moment of sampling at the sampling unit 2, 2', 2" and 2'".

In this particular example, all the sampling units 2 perform the sampling function when the rising clock edge of the clock signal CLK reaches the corresponding sampling tap position 10. For every rising clock edge entering from the first terminal 81 of the second delay line 8 and propagating down the delay line 8 towards the second terminal 82, the samplers 2, 2', 2", 2'" are activated/enabled in time sequences with interval difference between two consecutive sampling of propagation time τ equally to the adjacent sampling distance (ASD), divided by the propagation velocity, as can be expressed by:

$$\tau = \frac{ASD}{v_{propagation}}$$

It should be noted that during the first half of the clock period $T_{clock}$, all sampling units 2 perform the sampling function. Furthermore, it should be noted that the samples taken on the analog input signal IN, corresponds to the sample distancing 2·τ. This is due to the fact that the analog input IN and the clock signal CLK travel towards each other.

During the second half of the clock period $T_{clock}$, no sampling occurs. During this time the analog input signal IN propagates further on its tapped delay line 7 and advances down the first delay line 7 such that when the next rising clock edge reaches the tap number 0, the samples taken at samples number 0 corresponds to the analog value on the analog input signal IN distancing 2·τ from the last sample taken, namely sample number 3.

FIG. 8 shows a timing diagram of the implementation of an example embodiment of the present invention with four sampling units. In FIG. 8, the sampling outputs S_O1, S_O2, S_O3 and S_O4 are shown to indicate the moment in time when the sampling takes place on each of them. Also note that sample number 0 (at sampling point S0) corresponds to 2·τ after sample number 3 (at sampling point S3) on the analog input signal IN, hence, all the samplers are operating an interleaved mode for successive clock edges.

The clock deterministic and the random phase error are significantly reduced in this invention, since there is no need for significant phase adjustment clock. The clock phase adjustment on each sampler was a mature source of clock stability error and can be avoided with this inventive concept.

All features of all embodiments described, shown and/or claimed herein can be combined with each other.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth to scope of the present invention should not be limited by any of the above described embodiments. Rather, the scope of the invention should be defined in accordance with the following claims and their equivalences.

Although the invention has been illustrated and described with respect to one or more implementations, equivalent alterations and modifications will occur to others skilled in the art up in the reading and understanding of this specification and the annexed drawings. In addition, while a particular feature of the invention may have been disclosed, with respect to only one of several implementations, such feature may be combined with one or more other features of the other implementations as may be desired and will advantages for any given or particular application.

What is claimed:

1. An interleaved high frequency sampler apparatus comprising:
   a first delay line that comprises a first terminal, a plurality of distribution segments, a plurality of taps, and a second terminal, wherein each tap of the first delay line is arranged between two of the distributions segments that are adjacent to one another;
   a second delay line that comprises a first terminal, a plurality of distribution segments, a plurality of taps, and a second terminal, wherein each tap of the second delay line is arranged between two of the distributions segments that are adjacent to one another; and
   wherein each tap of the first delay line corresponds to a respective tap of the second delay line, and a respective sampling circuit is arranged between each tap of the first delay line and the corresponding tap of the second delay line, and
   wherein the first delay line and the second delay line are configured in a manner whereby an analog input signal applied to the first terminal of the first delay line propagates through the first delay line in a first direction, a clock signal applied to the first terminal of the second delay line propagates through the second delay line in a second direction, and the first direction is opposite to the second direction.

2. The interleaved high frequency sampler apparatus according to claim 1, wherein the first delay line is arranged in parallel to the second delay line, and the first terminal of the first delay line is arranged at an end of the first delay line that is arranged opposite to an end of the second delay line at which first terminal of the second delay line is arranged.

3. The interleaved high frequency sampler apparatus according to claim 1, wherein the first delay line and the second delay line each comprises a number of delay elements of equal dimensions, and the number of delay elements of the first delay line equals the number of delay elements of the second delay line.

4. The interleaved high frequency sampler apparatus according to claim 3, wherein each delay element comprises one or more of a transmission line and a discrete element.

5. The interleaved high frequency sampler apparatus according to claim 4, wherein each discrete element comprises a circuit arrangement that exhibits an inductance and a capacitance, wherein the capacitance is connected to a reference potential.

6. The interleaved high frequency sampler apparatus according to claim 1, wherein at least one tap of the first delay line is arranged in a position of relatively close proximity to a respective tap of the second delay line.

7. The interleaved high frequency sampler apparatus according to claim 1, wherein a delay element is arranged between each of one or more respective pairs of two adjacent taps of each of the first delay line and the second delay line, and each delay element of the first delay line is equivalent to a respective delay element of the second delay line.

8. The interleaved high frequency sampler apparatus according to claim 1, wherein the taps of the first and second delay lines are arranged in an equidistant manner.

9. The interleaved high frequency sampler apparatus according to claim 1, wherein a period of a clock signal of the interleaved high frequency sampler is at least equal to a sum of a signal propagation time between two consecutive taps of the second delay line and a signal propagation time between two consecutive taps of the first delay line multiplied by an interleave factor.

10. An analog-to-digital converter comprising the interleaved high frequency sampler according to claim 1.

11. The analog-to-digital converter according to claim 10, wherein an output of each sampling circuit is connected to a respective digitizing unit, wherein each digitizing unit is configured to digitize an output of the respective sampling unit.

12. An oscilloscope, for measuring a high frequency analog input signal, comprising:
- an input node configured to receive the high frequency analog input signal; and
- an analog-to-digital converter (ADC) according to claim 11, wherein the ADC is arranged downstream to the input node, and is configured to convert the high frequency analog input signal to a digital input signal.

* * * * *